United States Patent
White et al.

(10) Patent No.: US 10,431,889 B2
(45) Date of Patent: *Oct. 1, 2019

(54) LOW-LOSS COMPACT TRANSMIT IMPEDANCE MATCHING TUNING TECHNIQUE

(71) Applicant: The Charles Stark Draper Laboratory Inc., Cambridge, MA (US)

(72) Inventors: Douglas W. White, Lexington, MA (US); Warner G. Harrison, Medfield, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 243 days.

This patent is subject to a terminal disclaimer.

(21) Appl. No.: 15/456,430

(22) Filed: Mar. 10, 2017

(65) Prior Publication Data

US 2017/0310008 A1 Oct. 26, 2017

Related U.S. Application Data

(60) Provisional application No. 62/326,375, filed on Apr. 22, 2016.

(51) Int. Cl.
*H01Q 5/335* (2015.01)
*H03H 7/40* (2006.01)

(52) U.S. Cl.
CPC .............. *H01Q 5/335* (2015.01); *H03H 7/40* (2013.01)

(58) Field of Classification Search
None
See application file for complete search history.

(56) References Cited

U.S. PATENT DOCUMENTS

| 6,307,364 | B1 * | 10/2001 | Augustine | G01R 21/00 324/95 |
| 8,331,882 | B1 * | 12/2012 | McCune | H03G 3/007 330/129 |
| 8,472,904 | B2 | 6/2013 | White | |
| 8,774,743 | B2 | 7/2014 | Ali | |

(Continued)

OTHER PUBLICATIONS

Non-Final Office Action for U.S. Appl. No. 15/479,414 dated Mar. 8, 2018.

*Primary Examiner* — Fayyaz Alam
(74) *Attorney, Agent, or Firm* — Hamilton, Brook, Smith & Reynolds, P.C.

(57) ABSTRACT

An adaptive impedance matching network to implement an impedance match between an RF power device and an antenna comprises a matching network having at least one tunable component, a current sensor providing a current value corresponding to the supply current associated with the RF power device, a power sensor configured to provide an RF power sensor value monotonically related to power delivered to the antenna, and a tuner to provide a tuning signal to the matching network as a function of the current and RF power values. The tuner may adjust the tuning signal so that the RF power sensor value is at least as large as for other settings of the tuning signal, while maintaining the supply current at a predetermined amount corresponding to an amount of supply current occurring when the RF power device is driving a load that produces the desired RF output power and amplifier efficiency.

20 Claims, 4 Drawing Sheets

(56) References Cited

U.S. PATENT DOCUMENTS

| | | | |
|---|---|---|---|
| 9,671,765 B2* | 6/2017 | Manssen | G05B 13/02 |
| 9,716,311 B2* | 7/2017 | Greene | H04B 1/0458 |
| 10,110,261 B2 | 10/2018 | White | |
| 2008/0106350 A1* | 5/2008 | McKinzie | H03H 7/40 |
| | | | 333/17.3 |
| 2011/0086600 A1* | 4/2011 | Muhammad | H04B 1/0458 |
| | | | 455/120 |
| 2012/0112851 A1* | 5/2012 | Manssen | H03H 7/40 |
| | | | 333/101 |
| 2013/0322562 A1* | 12/2013 | Zhang | H04B 7/0404 |
| | | | 375/267 |
| 2013/0325149 A1* | 12/2013 | Manssen | G05B 13/02 |
| | | | 700/37 |
| 2015/0094968 A1* | 4/2015 | Jia | G06Q 40/04 |
| | | | 702/60 |
| 2016/0173172 A1* | 6/2016 | Greene | H04B 7/0404 |
| | | | 455/562.1 |
| 2017/0294712 A1* | 10/2017 | Russell | H04B 1/0458 |
| 2017/0310346 A1 | 10/2017 | White | |

* cited by examiner

LOW-LOSS COMPACT TRANSMIT IMPEDANCE MATCHING TUNING TECHNIQUE

RELATED APPLICATION(S)

This application claims the benefit of U.S. Provisional Application No. 62/326,375, filed on Apr. 22, 2016. The entire teachings of the above application are incorporated herein by reference.

GOVERNMENT SUPPORT

This invention was made with Government support. The Government has certain rights in the invention.

BACKGROUND

Small transmitters with high efficiency power amplifiers are especially susceptible to performance degradation if the impedance of the antenna is perturbed, for example by the presence of nearby objects or ice forming on the antenna. Such an impedance mismatch can be resolved by adding a tunable impedance matching network between the amplifier and the antenna. Conventional circuitry for measuring the antenna detuning and adjusting the matching network, however, typically requires additional space, and adds loss to the transmission path from the transmitter to the antenna. Further, such circuitry typically requires that both the power amplifier and the antenna each be nominally matched to a common real impedance (e.g., 50Ω).

SUMMARY OF THE INVENTION

The described embodiments provide a method of and system for adaptively matching a transmitter and an antenna through a tunable impedance matching network. The described embodiments may be utilized to match arbitrary (i.e., real and complex) antenna input impedances, and may exhibit higher efficiency (i.e., lower losses) as compared to existing matching solutions. Further, the described embodiments do not require certain monitoring devices, such as transmission line directional couplers, which add loss and occupy considerable physical space at typical cellular frequencies. Smaller couplers can be fabricated, but such miniaturized devices tend to exhibit higher losses than their larger counterparts.

The described embodiments trade off variations in the reflection loss against variations in the matching insertion loss to arrive at a tuning solution that maximizes the RF power delivered to the antenna, consistent with a desired DC power consumption. The described embodiments are not tied to real impedances at any point between the amplifier transistor and the antenna, which eliminates several loss mechanisms.

The described embodiments may be particularly useful for impedance matching to electrically small antennas. The term ""electrically small antenna"" is well known to one skilled in the art, and generally refers to an antenna having a volume that is smaller than a sphere defined by the boundary between the antenna's near fields and far fields. For an electrically small antenna, $2\pi r/\lambda \ll 1$, where r is the radius of a sphere surrounding the antenna, and $\lambda$ is the wavelength of the signal the antenna is transmitting or receiving. An electrically small antenna has a very low natural impedance, resulting in high losses when it is matched to operate in a 50Ω environment.

In one aspect, the invention is an adaptive impedance matching network to implement an impedance match between an output of an RF power source (or in some embodiments, an output of a constituent RF power device of the RF power source) and an input of an antenna, comprising a matching network having at least one tunable component, a current sensor configured to provide a current value corresponding to an amount of drain current associated with the RF power device, an RF power sensor configured to provide a power sensor value that is monotonically related to an amount of power delivered to the antenna, and a tuner configured to provide a tuning signal to the matching network, the tuning signal being a function of the current value and the power value.

The term ""drain current"" is used herein because the example embodiments of the RF power source utilize a field-effect transistor (FET) for the RF power device that amplifies an input signal. It should be understood, however, that as used herein, the term ""drain current"" may generally describe current supplied to the RF power device. So, for example, in some embodiments, the term ""drain current"" may alternatively describe the collector current for a bipolar device, or plate current for a vacuum tube device, in the RF power source. In some embodiments, the term ""supply current"" may alternatively be used.

In the example embodiments, the current sensor may be a direct current (DC) sensor, which senses the DC drain current to the RF power device and provides a current value corresponding to an amount of DC drain current. In alternative embodiments, the current sensor may provide a current value corresponding to other, non-DC types of drain current.

In one embodiment, the tuner adjusts the tuning signal to a setting that results in the power sensor value being at least as large as for other settings of the tuning signal(s), while maintaining the drain current value at a predetermined amount. The predetermined amount may be an amount of drain current that occurs when the RF power device is driving a load having an impedance that is a conjugate match to an output impedance of the RF power device. The predetermined amount may be within a range centered at an amount of drain current that occurs when the RF power device drives a load with an impedance that elicits a desired power output and efficiency from the RF power device.

The input impedance of the antenna may be complex. The tuner may generate the tuning signal or signals using a step-wise gradient search (e.g., a step-wise gradient ascent procedure). Such a gradient search may operate to seek a maximum of the RF power delivered to the antenna, while maintaining the optimal DC set point of the RF power device. The antenna may be an electrically small antenna.

In some embodiments, the power sensor may be an E-field probe configured to measure E-fields generated by the antenna. In other embodiments, the power sensor may be a capacitively-coupled probe configured to measure an RF voltage at the input (feedpoint) of the antenna.

In another aspect, the invention is a method of implementing an impedance match between an RF power device and an antenna comprising generating, with a current sensor, a current value corresponding to an amount of drain current associated with the RF power device. The method further comprises generating, with an RF power sensor, a power sensor value that is monotonically related to an amount of power delivered to the antenna. The method also comprises providing at least one tuning signal, generated as a function of the drain current value and the power sensor value, to a matching network having at least one tunable component."

In another aspect, the invention is a non-transitory computer-readable medium with computer code instruction stored thereon. The computer code instructions, when executed by a processor, cause an impedance matching network tuner to receive a current value corresponding to an amount of drain current associated with the power device, receive an RF power sensor value that is monotonically related to an amount of power delivered to the antenna, and generate at least one tuning signal as a function of the current value and the RF power sensor value, to a matching network having at least one tunable component.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

The described embodiments are directed to techniques for improving the impedance match between a transmitter and an antenna. The described embodiments are particularly useful for small transmitter/antenna systems, because efficiency is crucial for such small systems due to, for example, limited input power resources (e.g., scarce battery space).

Figure 1:
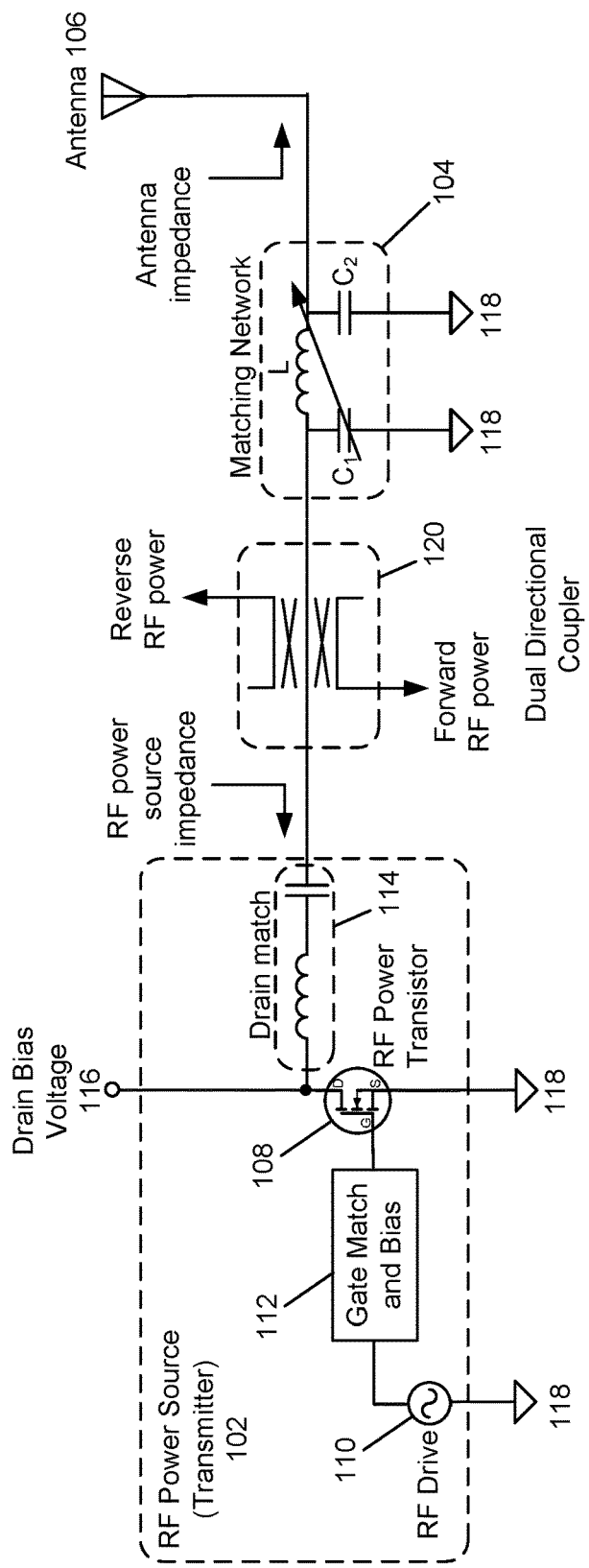
FIG. 1 shows an example transmitter/antenna configuration relevant to the described embodiments.

FIG. 1 illustrates an example transmitter/antenna configuration relevant to the described embodiments. The example shown in FIG. 1 includes an RF power source 102, a matching network 104, and an antenna 106. The RF power source 102 includes an RF power transistor 108, an RF drive source 110, a gate match and bias network 112, and a drain match network 114.

The RF drive source 110 provides an RF signal, through the gate match and bias network 112 to the gate of an RF power device, the RF power transistor 108 in this example embodiment. The RF signal causes the RF power transistor 108 to control the flow of current from the drain bias voltage source 116 to ground 118. The output of the RF power source 102, taken from the drain of the RF power transistor 108, is conditioned by the drain match network 114 to present a specific impedance (e.g., 50Ω) at the output of the RF power source 102.

The RF power source 102 drives the antenna 106 through the matching network 104. The forward and reflected power may be monitored by a dual directional coupler 120. The matching network 104 is configured to provide a conjugate match between the output impedance of the RF power source 102 and the antenna impedance.

In the described embodiments, the matching network 104 is electronically tunable, meaning that the electrical characteristics of components of the matching network 104 can be varied by control signals applied to the matching network 104. While the example of FIG. 1 shows a tunable "pi" configuration matching network, the described embodiments may be used in conjunction with any tunable matching network.

One technique for tuning a variable matching network is to sense, using techniques known in the art, RF current provided to the input of the antenna. Such techniques generate control signals to be applied to the tunable matching network based on the sensed RF current. Such techniques, however, do not facilitate controlling the current through the RF transmitter power transistor to optimize the transmitter efficiency. Typical RF current sensors are also bulky, lossy, and require installation at a point in a system where there is a fixed, real impedance (e.g., 50Ω).

Another technique for tuning a variable matching network is to sense, using techniques known in the art (for example, a dual directional coupler 120), RF power directed from the RF transmitter toward the tunable matching network (incident power) and RF power reflected from the tunable matching network back toward the RF transmitter (reflected power). Such techniques generate control signals to be applied to the tunable matching network based on the incident power and the reflected power. These techniques, however, do not facilitate the delivery of optimum power to the antenna. Because the loss through the tunable matching network is not fixed, tuning for minimum reflected power does not take into account the possibility that the loss through the matching network may be significantly higher than at a slightly different tuning point. Further, typical directional couplers are generally bulky and lossy.

Figure 2:
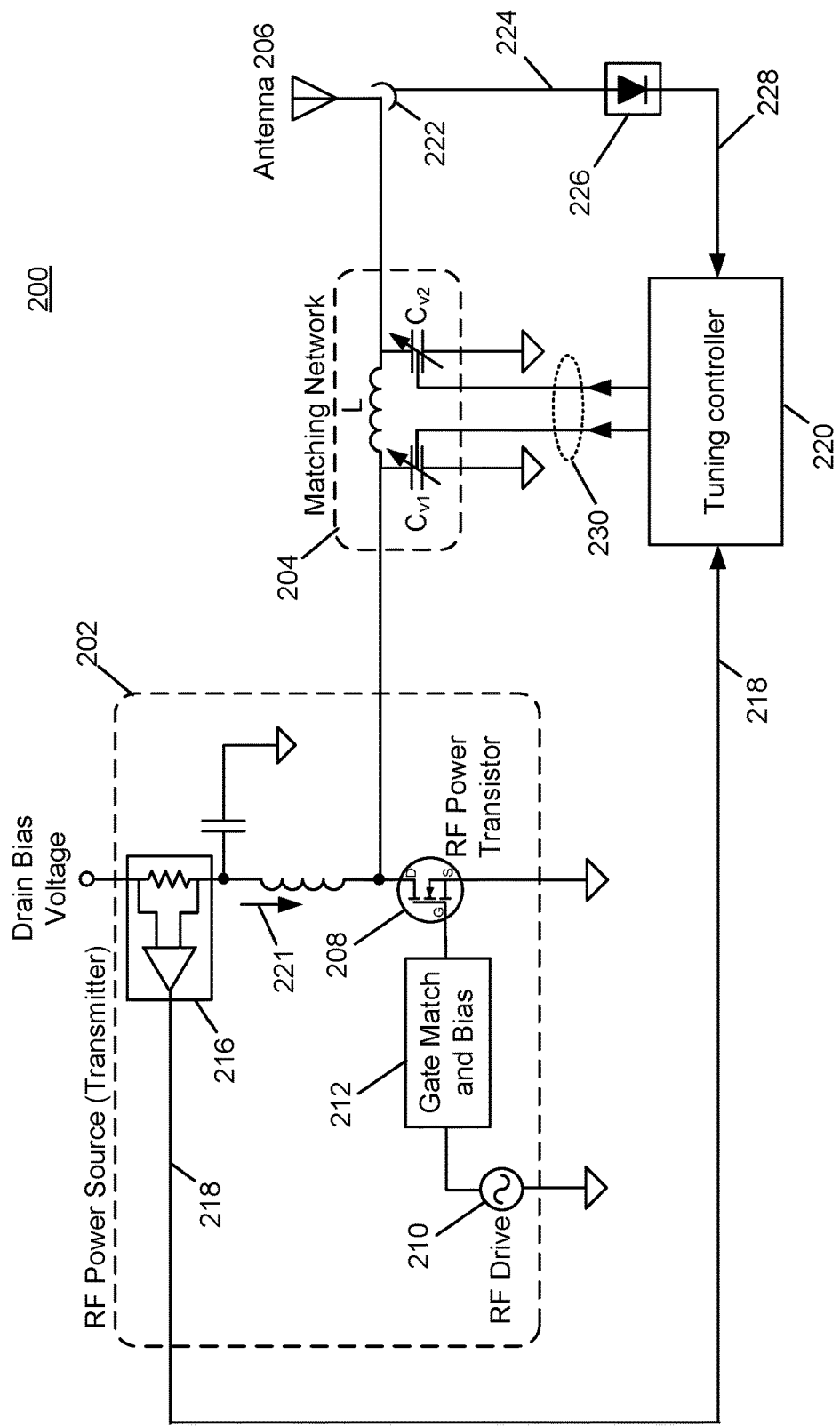
FIG. 2 illustrates an example embodiment of adaptive impedance matching network constructed according to the invention.

FIG. 2 illustrates an example embodiment of adaptive impedance matching network 200 constructed according to the invention. The adaptive impedance matching network 200 includes an RF power source 202, a tunable matching network 204 and an antenna 206. The RF power source 202 includes an RF power transistor 208, an RF drive source 210, and a gate match and bias network 212.

The RF drive source 210 provides an RF signal, through the gate match and bias network 212 to the gate of the RF power transistor 208. The output of the RF power source 202, taken from the drain of the RF power transistor 208, feeds the tunable impedance matching network 204. The tunable matching network 204 presents a desired load impedance to the RF power source 202. This desired load impedance has been determined to elicit a desired (e.g., optimal) output power and efficiency at the output of the RF power source 202.

The RF power source 202 further includes a DC drain current monitor 216 that provides a drain current sense signal 218 to a tuning controller 220 that corresponds to the DC drain current 221 supplied to the RF power transistor 208. In this example embodiment, the DC drain current monitor 216 employs a resistor and a differential amplifier, which produces the drain current sense signal 218 that is an amplified version of the voltage drop across the resistor. It should be understood, however, that other techniques known in the art for sensing an amount of current flow, DC or otherwise, may alternatively be used.

The RF power source 202 drives the antenna 206 through the tunable matching network 204. The tunable matching network 204 comprises one or more electrically tunable components, the electrical characteristics of which can be varied by control signals. The electrically tunable components are responsive to control signals from the tuning controller 220.

In the described embodiments, the tuning controller 220 provides one or more control signals to the tunable matching network 204 to configure the tunable matching network 204 to provide the desired load impedance to the RF power source 202, while presenting a conjugate match to the antenna impedance. While the example of FIG. 1 shows a "pi" configuration matching network, with two electrically-variable capacitors $C_{v1}$ and $C_{v2}$ arranged in shunt to the signal path from the RF power source, and a fixed-value inductor L in series with the signal path and between the two variable capacitors, the described embodiments may alternatively be used in conjunction with other electrically tunable matching networks.

The adaptive impedance matching network 200 may operate in conjunction with a capacitive/E-field probe 222 disposed at or near the feedpoint of the antenna 206, or disposed within the antenna 206.

In some embodiments, the probe 222 may monitor the RF voltage at or near the feedpoint of the antenna 206 through capacitive coupling.

In other embodiments, the probe 222 may monitor E-fields within the antenna structure by integrating or otherwise associating the probe 222 with the antenna itself. U.S. Pat. No. 8,472,904, entitled "Antenna With Integrated Tuning Detection Elements," describes examples of such probes that monitor E-fields within an antenna.

In either case, the RF signal 224 produced by the probe 222 is converted, by an RF detector 226 to an RF sense signal 228 that is monotonically related to the RF power delivered to the antenna 206, i.e., the RF sense signal 228 increases monotonically with respect to the RF power delivered to the antenna 206.

The tuning controller 220 may generate one or more control signals 230 based on the drain current sense signal 218 and the RF sense signal 228. In embodiments, the tuning controller 220 may generate the control signals 230 to result in a maximum amount of RF power being delivered to the antenna while the RF power source 202 is operating at an optimal set point. The optimal set point of the RF power source 202 is characterized by the values of certain parameters of the RF power source 202 when the RF power source 202 is driving a load having an impedance that elicits the desired output power and efficiency from the RF power source 202. In embodiments, the drain current 221 may be a parameter used to characterize the optimal set point of the RF power source 202.

In some embodiments, the tuning controller 220 may generate the control signals 230 by conducting a gradient search (e.g., a step-wise gradient ascent procedure). Such a gradient search may operate to seek a maximum of the RF power delivered to the antenna 206 (based on the RF sense signal 228), while maintaining the optimal set point of the RF power source 202 (based on the drain current sense signal 218).

In other embodiments, the tuning controller 220 may use other maxima determining techniques known in the art to generate the control signals 230 that result in a maximum amount of RF power being delivered to the antenna while the RF power source 202 is operating at an optimal set point.

Figure 3:
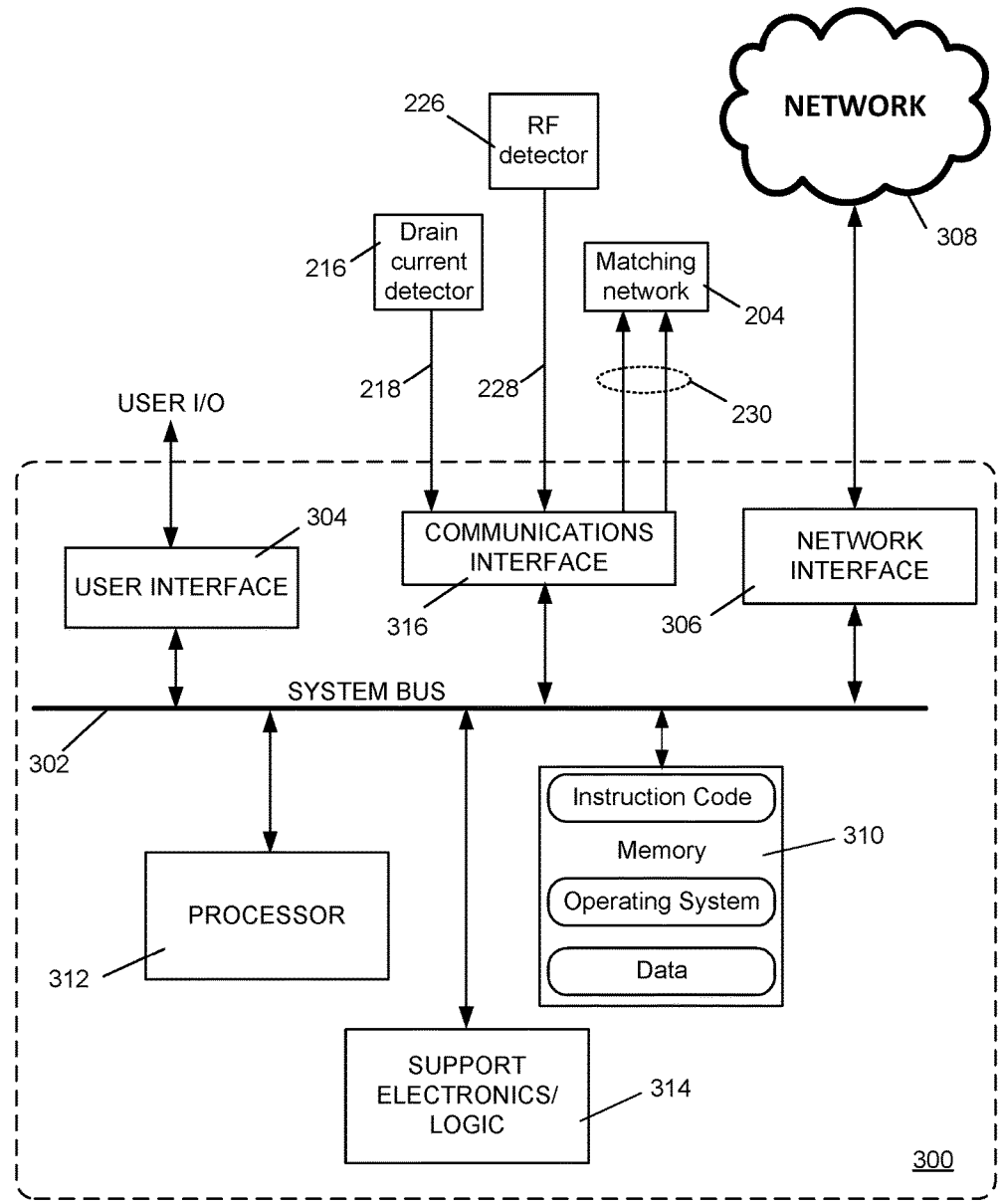
FIG. 3 shows a diagram of an example internal structure of a processing system that may be used to implement a tuning controller of the invention.

FIG. 3 is a diagram of an example internal structure of a processing system 300 that may be used to implement one or more of the embodiments of the tuning controller 220 described herein. Other processing structures may alternatively be used.

The processing system 300 may contain a system bus 302, where a bus may be a set of hardware lines used for data transfer among the components of a computer or processing system. The system bus 302 is essentially a shared conduit that connects different components of a processing system (e.g., processor, disk storage, memory, input/output ports, network ports, etc.) that enables the transfer of information between the components.

Attached to the system bus 302 may be a user I/O device interface 304 for connecting various input and output devices (e.g., keyboard, mouse, displays, printers, speakers, etc.) to the processing system 300. A network interface 306 allows the computer to connect to various other devices attached to a network 308. Memory 310 provides volatile and non-volatile storage for information such as computer software instructions used to implement one or more of the embodiments of the present invention described herein. Memory 310 also provides volatile and non-volatile storage for data generated internally and for data received from sources external to the processing system 300.

A central processor unit 312 is also attached to the system bus 302 and provides for the execution of computer instructions stored in memory 310. The system may also include support electronics/logic 314, and a communications interface 316. The communications interface may receive the drain current sense signal 218 from the drain current sensor 216, and the RF sense signal 228 from the RF detector 226. The communications interface 316 may provide the control signals 230 to the matching network 204.

In one embodiment, the information stored in memory 310 may comprise a computer program product, such that the memory 310 may comprise a non-transitory computer-readable medium (e.g., a removable storage medium such as one or more DVD-ROM's, CD-ROM's, diskettes, tapes, etc.) that provides at least a portion of the software instructions for the invention system. The computer program product can be installed by any suitable software installation procedure, as is well known in the art. In another embodiment, at least a portion of the software instructions may also be downloaded over a cable communication and/or wireless connection.

Figure 4:
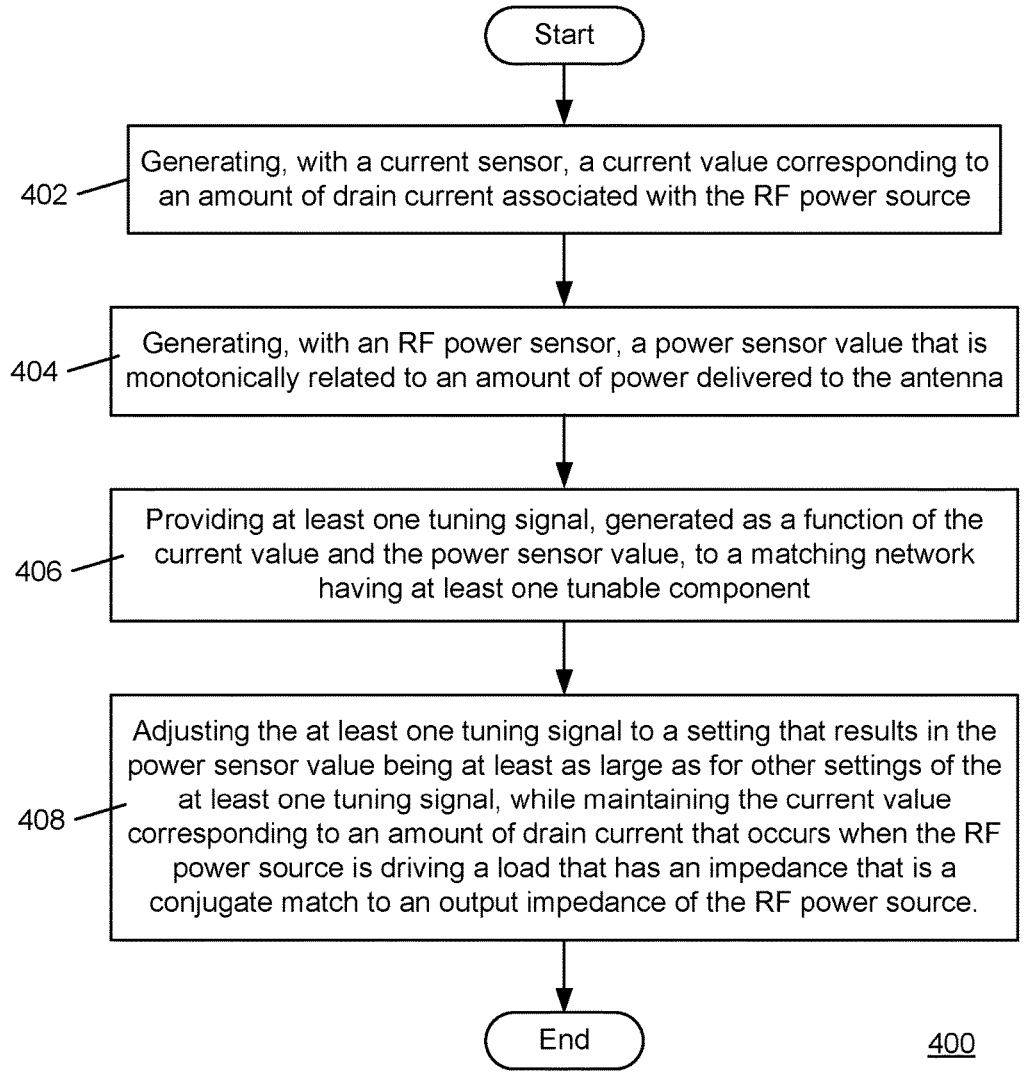
FIG. 4 illustrates one embodiment of a method of implementing an impedance match between an RF power device and an antenna.

FIG. 4 illustrates one embodiment of a method 400 of implementing an impedance match between an RF power source and an antenna comprising generating 402, with a current sensor, a current value corresponding to an amount of drain current associated with the RF power source, and generating 404, with an RF power sensor, a power sensor value that is monotonically related to an amount of power delivered to the antenna. The method further comprises providing 406 at least one tuning signal, generated as a function of the current value and the power sensor value, to a matching network having at least one tunable component. In some embodiments, the method further comprises adjusting 408 the at least one tuning signal to a setting that results in the power sensor value being at least as large as for other settings of the tuning signal(s), while maintaining the current value corresponding to an amount of drain current that occurs when the RF power source is driving a load that has an impedance that elicits the desired output power and efficiency from the RF power source 202.

It will be apparent that one or more embodiments described herein may be implemented in many different forms of software and hardware. Software code and/or specialized hardware used to implement embodiments described herein is not limiting of the embodiments of the invention described herein. Thus, the operation and behavior of embodiments are described without reference to specific software code and/or specialized hardware—it being understood that one would be able to design software and/or hardware to implement the embodiments based on the description herein.

Further, certain embodiments of the example embodiments described herein may be implemented as logic that performs one or more functions. This logic may be hardware-based, software-based, or a combination of hardware-based and software-based. Some or all of the logic may be stored on one or more tangible, non-transitory, computer-readable storage media and may include computer-executable instructions that may be executed by a controller or processor. The computer-executable instructions may include instructions that implement one or more embodiments of the invention. The tangible, non-transitory, computer-readable storage media may be volatile or non-volatile and may include, for example, flash memories, dynamic memories, removable disks, and non-removable disks.

While this invention has been particularly shown and described with references to example embodiments thereof, it will be understood by those skilled in the art that various changes in form and details may be made therein without departing from the scope of the invention encompassed by the appended claims.

What is claimed is:

1. An adaptive impedance matching network to implement an impedance match between an output of an RF power device and a feedpoint of an antenna, comprising:
   a matching network having at least one tunable component;
   a current sensor configured to provide a current value corresponding to an amount of supply current associated with the RF power device, the RF power device being one of a field effect transistor device, a bipolar transistor device, and a vacuum tube device;
   an RF power sensor configured to provide a power sensor value that is monotonically related to an amount of power delivered to the antenna; and
   a tuner configured to provide a tuning signal to the matching network, the tuning signal being a function of the current value and the power sensor value.

2. The adaptive impedance matching network of claim 1, wherein the tuner adjusts the tuning signal to a setting that results in the power sensor value being at least as large as for other settings of the tuning signal, while maintaining the supply current value at a predetermined amount.

3. The adaptive impedance matching network of claim 2, wherein the predetermined amount is an amount of supply current that occurs when the RF power device is driving a load having an impedance that elicits a desired power output and efficiency from the RF power device.

4. The adaptive impedance matching network of claim 2, wherein the predetermined amount is within a range centered at an amount of supply current that occurs when the RF power device drives a load with an impedance that elicits a desired power output and efficiency from the RF power device.

5. The adaptive impedance matching network of claim 1, wherein an input impedance of the antenna is complex.

6. The adaptive impedance matching network of claim 1, wherein the tuner generates the at least one tuning signal using a step-wise gradient search.

7. The adaptive impedance matching network of claim 1, wherein the antenna is an electrically small antenna.

8. The adaptive impedance matching network of claim 1, wherein the power sensor is an E-field probe configured to measure E-fields generated by the antenna.

9. The adaptive impedance matching network of claim 1, wherein the power sensor is a capacitively-coupled probe configured to measure an RF voltage at the feedpoint of the antenna.

10. A method of implementing an impedance match between an RF power device and an antenna, comprising:
    generating, with a current sensor, a supply current value corresponding to an amount of supply current associated with the RF power device, the RF power device being one of a field effect transistor device, a bipolar transistor device, and a vacuum tube device;
    generating, with an RF power sensor, a power sensor value that is monotonically related to an amount of power delivered to the antenna; and
    providing a tuning signal, generated as a function of the supply current value and the power sensor value, to a matching network having at least one tunable component.

11. The method of claim 10, further including adjusting the tuning signal to a setting that results in the power sensor value being at least as large as for other settings of the tuning signal, while maintaining the supply current value at a predetermined amount.

12. The method of claim 11, further including determining the predetermined amount by measuring an amount of supply current that occurs when the RF power device is driving a load that has an impedance that elicits a desired power output and efficiency from the RF power device.

13. The method of claim 11, further including establishing the predetermined amount as a range centered at an amount of supply current that occurs when the RF power device is driving a load having an impedance that elicits a desired power output and efficiency from the RF power device.

14. The method of claim 10, further including generating the at least one tuning signal by varying the at least one tuning signal according to a step-wise gradient evaluation of the supply current value and the power sensor value.

15. The method of claim 10, further including generating the power sensor value by measuring E-fields of the antenna with a capacitively-coupled probe.

16. The method of claim 10, further including generating the power sensor value by measuring an RF voltage at the input of the antenna.

17. A non-transitory computer-readable medium with computer code instruction stored thereon, the computer code instructions, when executed by a processor, cause an impedance matching network tuner to:
    receive a supply current value corresponding to an amount of supply current associated with the power device, the RF power device being one of a field effect transistor device, a bipolar transistor device, and a vacuum tube device;
    receive an RF power sensor value that is monotonically related to an amount of power delivered to the antenna; and
    generate at least one tuning signal as a function of the supply current value and the RF power sensor value, to a matching network having at least one tunable component.

18. The non-transitory computer-readable medium of claim 17, wherein the computer code instructions, when executed by the processor, further cause the impedance matching network tuner to adjust the at least one tuning signal to a setting that results in the RF power sensor value being at least as large as for other settings of the at least one tuning signal, while the supply current value is maintained at a predetermined amount.

19. The non-transitory computer-readable medium of claim 17, wherein the computer code instructions, when executed by the processor, further cause the impedance matching network tuner to generate the at least one tuning signal by varying the at least one tuning signal according to a step-wise gradient evaluation of the supply current value and the power value.

20. A method of determining an amount of supply current to an RF power device that corresponds to a desired power output and efficiency of the RF power device, comprising:
   electrically coupling the RF power device to a load configured to have an impedance that produces the desired RF output power and amplifier efficiency;
   applying an RF drive source signal to the RF power device;
   measuring the supply current flowing to the RF power device.

* * * * *